United States Patent [19]
Bahr et al.

[11] Patent Number: 5,285,143
[45] Date of Patent: Feb. 8, 1994

[54] MEASUREMENT OF LOAD CURRENT IN A MULTI-PHASE POWER AMPLIFIER

[75] Inventors: Allen A. Bahr; Tony R. Larson, both of Tucson, Ariz.

[73] Assignee: International Business Machines Corporation, Armonk, N.Y.

[21] Appl. No.: 96,863

[22] Filed: Jul. 26, 1993

Related U.S. Application Data

[63] Continuation of Ser. No. 740,833, Aug. 6, 1991.

[51] Int. Cl.[5] .......................... H02P 5/28; H03F 3/04
[52] U.S. Cl. ..................... 318/805; 318/677; 363/97; 330/288
[58] Field of Search .................. 324/73, 130; 361/315, 361/316, 287; 363/21, 97; 318/687, 135, 679, 678, 432, 599, 805, 677; 330/199, 127, 113, 250, 288

[56] References Cited

U.S. PATENT DOCUMENTS

| | | | |
|---|---|---|---|
| 4,553,084 | 11/1985 | Wrathall | 323/316 |
| 4,713,607 | 12/1987 | Pepper | 324/73 |
| 4,727,309 | 2/1988 | Vajdic et al. | 323/315 |
| 4,804,903 | 2/1989 | Yundt | 324/130 |
| 4,820,968 | 4/1989 | Wrathall | 323/316 |
| 4,827,207 | 5/1989 | Chieli | 323/316 |
| 4,860,153 | 8/1989 | Ichii | 361/94 |
| 4,945,445 | 7/1990 | Schmerda et al. | 361/101 |
| 4,967,309 | 10/1990 | Hoffman | 318/432 |
| 5,113,158 | 5/1992 | Tsuji et al. | 318/599 |
| 5,138,543 | 8/1992 | Harm et al. | 363/97 |

Primary Examiner—William M. Shoop, Jr.
Assistant Examiner—John W. Cabeca
Attorney, Agent, or Firm—D. A. Shifrin; F. E. Anderson

[57] ABSTRACT

A power amplifier supplies substantial load currents that must be accurately monitored to provide feedback so that the load currents can be properly controlled. A sense current is generated from a load current that is scaled such that the sense current is an accurate representation of the load current but having a substantially smaller magnitude. The scaled sense current is generated by coupling a power sense resistor to a pilot sense resistor by a voltage follower. The power sense resistor is in series with the load current and develops a load voltage thereacross. A sense voltage, being substantially equal to the load voltage is impressed at the pilot sense resistor by the voltage follower. The pilot sense resistor is some predetermined ratio of the power sense resistor so that absolute values are not critical. The sense current flowing through the pilot sense resistor is therefore scaled according to the ratios of the power and pilot sense resistors. A current mirror supplies current to the voltage follower and a cascode current mirror is further connected to the current mirror to diminish an undesired Early effect in the transistors making up the voltage follower and the current mirror. The sense current accurately follows the load current even over high frequencies.

26 Claims, 2 Drawing Sheets

MEASUREMENT OF LOAD CURRENT IN A MULTI-PHASE POWER AMPLIFIER

This is a continuation of co-pending U.S. application Ser. No. 07/740,833, filed Aug. 6, 1991.

FIELD OF THE INVENTION

This invention relates generally to the field of semiconductor power amplifiers and more particularly, to a semiconductor device for providing a current to a load, for example, a motor, and monitoring the load current by generating a scaled representative current.

BACKGROUND OF THE INVENTION

Monolithically integrated semiconductor circuits have the ability to provide large currents to a load. These load currents must be accurately monitored to ensure that the proper current magnitude is being supplied, thereby correctly driving the load and/or preventing damage. A power amplifier driving a tape drive motor is an example of such an application. The tape drive motor typically requires a large current wherein the magnitude must be known at any time. As tape is moved from one reel to another, a tension develops across the tape resulting from a differential torque between the two reels. The tape tension must be great enough to properly read data therefrom as it passes over a tape head, but not so great as to stretch or break the tape. Consequently, the motor current must be known to accurately control the differential torque.

A design goal of a power amplifier is to present the least resistance possible in those devices in series with the load. Obviously, if a load current is large, even a small resistance in series therewith will develop a substantial voltage drop. This in turn adversely affects the power amplifier efficiency. Vertical metal oxide semiconductor (VMOS) technology and lateral drain metal oxide semiconductor (LDMOS) technology are examples of a technologies employing devices capable of supplying large currents while having very low transistor channel resistances. In LDMOS technology, for example, a NMOS transistor's gate is driven to a voltage magnitude substantially higher than the voltage magnitude at its drain by a charge pump circuit. As a result, the transistor operates in a deep linear region such that its $R_{dson}$ (resistance from source to drain with the channel turned on) is minimized. This provides a very efficient transfer of load current to the motor or other load.

In order to provide feedback for properly driving the load, the load current must be monitored. Several problems are encountered in accurately monitoring the load current. The load current is large, and is switched on and off at high frequencies. Tape drive motors present this type of load current measurement problem. The tape drive motor is typically controlled by pulse width modulating (PWM) control signals for pulsing the load pulse load voltage to maintain an average current at high frequencies. The torque applied to the motor, and hence the tension developed across the tape as it passes over a tape head, is critical for reliably reading the data from the tape. The load current must, therefore, be accurately monitored so that the pulse width may be adjusted accordingly.

A simple method for monitoring the load current involves inserting a current sense device in series with the load to measure the load current. This method has at least two drawbacks. The current sense device introduces additional resistance in series with the load current, and hence, lowers the power amplifier efficiency. Furthermore, the load current tracking accuracy is limited by the current sense device accuracy which is susceptible to many semiconductor processing variations. Pepper, in U.S. Pat. No. 4,713,607, describes a current sensing scheme for determining whether a current exceeds a predetermined level. A conductive trace, having a predetermined resistance on an etched circuit board, is connected in series with the load. A comparator is coupled to the conductive trace for comparing a voltage developed at a first point on the trace to a reference voltage at a second point on the trace. The conductive trace, therefore, is the sense element. This scheme does not continuously monitor the load current but merely checks for a predetermined current magnitude. Pepper's invention relies on a sense element and comparator that are not integrated on the same semiconductor substrate as the power devices.

A similar technique is taught by Schmerda, et al., in U.S. Pat. No. 4,945,445 wherein a wire bond is used as the sense element which is in series with the load for sensing load current. Two points separated by a predetermined distance on the wire bond are coupled to a comparator for determining the voltage differential therebetween and hence the current. This invention has the advantage of not introducing additional resistance in series with the load. Like Pepper, the sense element and associated signal processing circuitry is not integrated on the same substrate as the power amplifier. Furthermore, the sense element here acts as a fuse such that load current is not continuously sensed. A technique using an off chip sense resistor and signal processing circuitry for monitoring the current sourced in a power supply is described by Ishii in U.S. Pat. No. 4,860,153.

Another sense resistor technique is taught by Yundt in U.S. Pat. No. 4,804,903. Yundt describes a monitoring apparatus using two operational amplifiers isolated from the power amplifier by coupling capacitors. This circuit is unable to operate at a 100% duty cycle, and is unsuitable for direct current or high frequency applications.

All current sensing techniques described above have an inherent inaccuracy effect resulting from the sensing element and the signal processing circuitry being separate components from the power amplifier. One aspect of this inaccuracy, for example, results from differing environmental conditions of the sense element and the power amplifier.

Load current monitoring accuracy can be improved by integrating the sense element and signal processing circuitry on the same semiconductor substrate as the power amplifier or switching transistors. Vajdic, et al., describe, in U.S. Pat. No. 4,727,309, a current source which is stable over operating condition changes wherein two current sources vary similarly over the span of operating conditions. Another integrated approach is set forth by Chieli in U.S. Pat. No. 4,827,207, wherein a load current flowing through a first switching device is mirrored into a second switching device. A sense voltage at the first device is duplicated at the second device. An operational amplifier then process the duplicated sense voltage information.

In U.S. Pat. No. 4,553,084, Wrathall describes a current sensing circuit incorporating a pilot sense transistor having a sensing resistor in its source leg. The pilot sense transistor is a portion of a large switching transistor and so variations in the large switching transistor can be accurately tracked by the pilot sense transistor. An operational amplifier monitors the signal provided by the sensing resistor for providing feedback information to a driver circuit. Wrathall describes another apparatus for sensing load current in U.S. Pat. No. 4,820,968 which uses a sense resistor in the leg of a current mirroring transistor to convert a mirrored current into a voltage. This voltage is then compared to a reference voltage generated by a reference current which is a equal to a portion of the load current.

A problem associated with the integrated current monitoring inventions described above is with monitoring load currents having high frequency switching characteristics, for example, high frequency PWM. This problem arises because power amplifier technology is necessarily optimized for efficient power or switching transistors. As a result, the integrated operational amplifiers suffer in speed and accuracy.

Thus what is needed is a load current monitoring circuit for accurately generating a sense current that is a fraction of the load current wherein the monitoring circuit is integrated onto the same substrate as the power or switching transistors and is capable of operating at high frequencies.

SUMMARY OF THE INVENTION

Accordingly, it is an object of the present invention to provide an improved integrated current monitoring circuit.

Another object of the present invention is to provide an integrated current monitoring circuit for accurately sensing large load currents by generating a scaled sense current.

Yet another object of the present invention is to provide an integrated current monitoring circuit capable of accurately monitoring a large load being pulse width modulated at high frequencies.

These and other objects of this invention are accomplished by a sensing circuit for sensing a load current by generating a sense current therefrom, the sense current being a predetermined fraction of the load current. The sense circuit accuracy is improved by integrating the sense circuit on the same semiconductor substrate as the power amplifier that is providing the load current. A first sense element is coupled in series with the load for receiving the load current and providing a load voltage therefrom. A voltage follower is coupled to the first sense element for receiving the load voltage and providing a sense voltage therefrom, the sense voltage being substantially equal to the load voltage. A second sense element is also coupled to the voltage follower for receiving the sense voltage therefrom and providing a reference for the sense current. A current mirror provides a bias current to the voltage follower and mirrors a sense current to the first sense element. The first and second sense elements may be any two terminal device having a predictable voltage/current relationship, for example, diodes, diode connected transistors, or resistors. The first and second sense elements are matched devices (although scaled), and the absolute values are not critical since variations will track. Furthermore, because critical signal processing circuits, i.e., operational amplifiers, are not required, the sensing circuit operates accurately at high frequencies.

The foregoing and other objects, features and advantages of the invention will be apparent from the following more particular description of the preferred embodiment of the invention, as illustrated in the accompanying drawing.

DESCRIPTION OF THE PREFERRED EMBODIMENT

Figure 1:
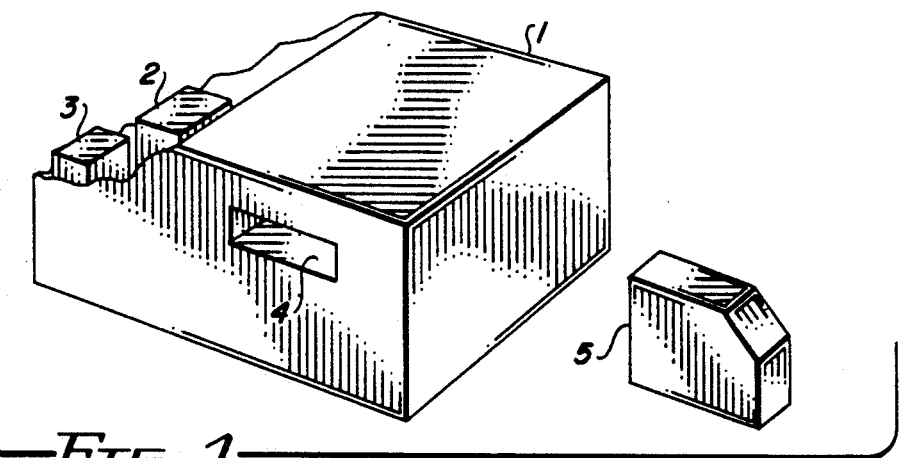
FIG. 1 is a cutaway view of a tape drive unit for reading magnetic tape cartridges.

Common elements to the several figures are represented by primed numbers. FIG. 1 is a cutaway view of a tape drive unit 1 for reading and writing magnetic tape cartridges, for example, a tape cartridge 5 which can be inserted into a slot 4. The tape drive unit 1 includes at least one multi-phase motor 2 to drive spindles (not shown) for advancing tape in the tape cartridge 5. A pulse width modulation (PWM) power amplifier 3 supplies a load current to the multi-phase motor 2. The load current supplied to the multi-phase motor 2 is pulse width modulated, typically at very high frequencies. The load current pulse width is varied to obtain the desired magnitude of load current. An accurate load current magnitude is obtained by measuring the load current and providing feedback to a control loop (not shown).

Figure 2:
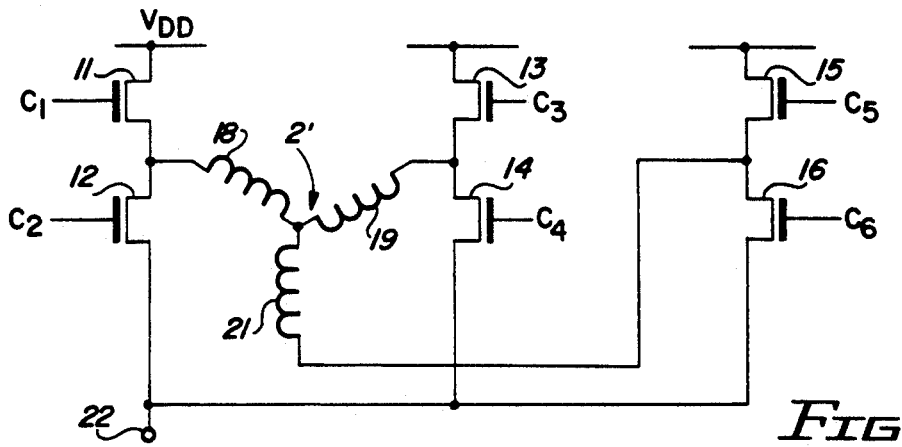
FIG. 2 is a schematic diagram of a motor drive circuit for proving a large load current to a motor.

FIG. 2 schematically depicts a portion of the power amplifier 3. A multi-phase motor 2' is shown having separate windings 18, 19 and 21. By turning on and off the proper combination of power transistors 11-16 the load current can be made to flow through each combination of the windings 18, 19, and 21. As a result, the speed and direction of the multi-phase motor 2' may be controlled by the power transistors 11-16 with the load current flowing into node 22. A discharge path must be provided for the load current when the transistors are open. The discharge path may be formed by properly connected diodes (not shown) typically associated with the power transistors 11-16 as is well known by those skilled in the art. The load current magnitude can exceed one ampere, and thus the transistors 11-16 are power field effect transistors optimized to supply large currents efficiently. Very importantly, the $R_{dson}$ (resistance from source to drain with a transistor channel conducting) of the power transistors 11-16 must be minimized. $R_{dson}$ is substantially affected by the structure and technology chosen for implementing power transistors. Semiconductor technologies chosen to implement the power transistors 11-16 include, for example, vertical metal oxide semiconductor (VMOS) and lateral drain metal oxide semiconductor (LDMOS).

Each of the power transistors 11-16 is typically implemented as a single small transistor cell replicated thousands of times and connected in parallel. Therefore, each of the power transistors 11-16 thus requires a substantial silicon area. Efficiency can be further increased by driving the power transistors 11, 13, and 15 with a charge pump circuit (not shown). A charge pump circuit generates a voltage having a magnitude greater than its supply voltage using capacitive techniques as is well known by those skilled in the art. A gate of each transistor 11, 13, and 15 may thus be driven to a voltage exceeding the voltage at each respective drain to further reduce $R_{dson}$. The area and efficiency requirements for driving large currents require that the technology chosen be optimized for the power transistors.

The technology chosen, however, has additional circuit considerations. The load current, for example, must be accurately monitored with the results fed back to pulse width modulation circuitry (not shown). Errors in monitoring due to environmental considerations are minimized by integrating appropriate monitoring and feedback circuitry on the same semiconductor substrate as the power field effect transistors 11-16. Integrated feedback and monitoring circuits typically include the use of at least one operational amplifier. Because the technology is optimized for power, these operational amplifiers are not able to accurately follow high frequency pulse width modulated load currents.

Figure 3A:
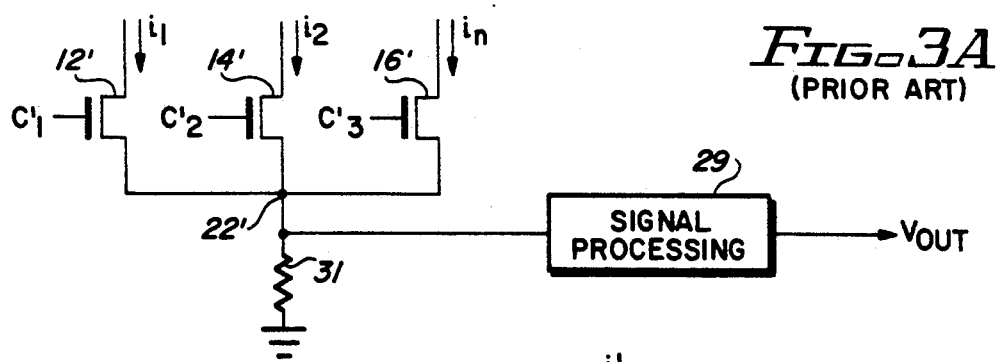
FIG. 3A is a schematic diagram of a prior art current sensing circuit using a sense resistor and signal processing circuitry.

FIG. 3A shows a known integrated load current monitoring solution. A power sense resistor 31 is introduced into the load current path at node 22'. When the load current flows through the power sense resistor 31 a power voltage develops thereacross that is proportional to the load current. The load current is the sum of currents $i_1$, $i_2$, through $i_n$. The load voltage polarity alternates with the PWM rate. A signal processing circuit 29, for example, an operational amplifier, rectifies and amplifies the power voltage. The amplified positive portions of the power voltage is used to adjust the pulse width to produce the desired load current. Because the signal processing circuit 29 is implemented in power transistor optimized technology its frequency response is unduly limited. Furthermore, accuracy is limited to the accuracy of the power sense resistor 31.

Figure 3B:
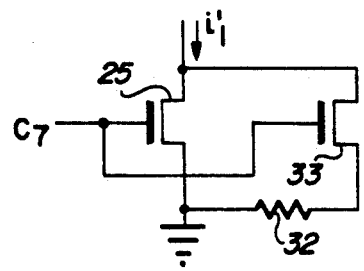
FIG. 3B is a schematic diagram of a prior art current sensing circuit using a pilot field effect transistor with a source resistor.

FIG. 3B shows another known current monitoring solution using a pilot FET or sense FET 33 having a resistor 32 in series with its source. A sense FET is a scaled FET, often one cell of the thousands of cells making up a power FET, having its drain and gate connected to the power FET 25 drain and gate, respectively. The sense FET 33 produces a scaled copy of a power FET 25 load current. A voltage may then be monitored across the resistor 32. The resistor 32, however, modifies the sense FET 33 source voltage which introduces error. More specifically, the sense FET 33 is unable to accurately sense the power FET 25 load current when the power FET 25 operates in its linear region. The power FET 25 is driven far into its linear region to minimize $R_{dson}$. The voltage monitored across the resistor 32 is typically processed by an operational amplifier having the same limitations as described regarding the signal processing circuit 29. The accuracy provided by the sense FET 33 may be improved by making the voltages at the drain, gate and source match the voltages at the drain, gate and source, respectively, of the power FET 25.

Figure 4:
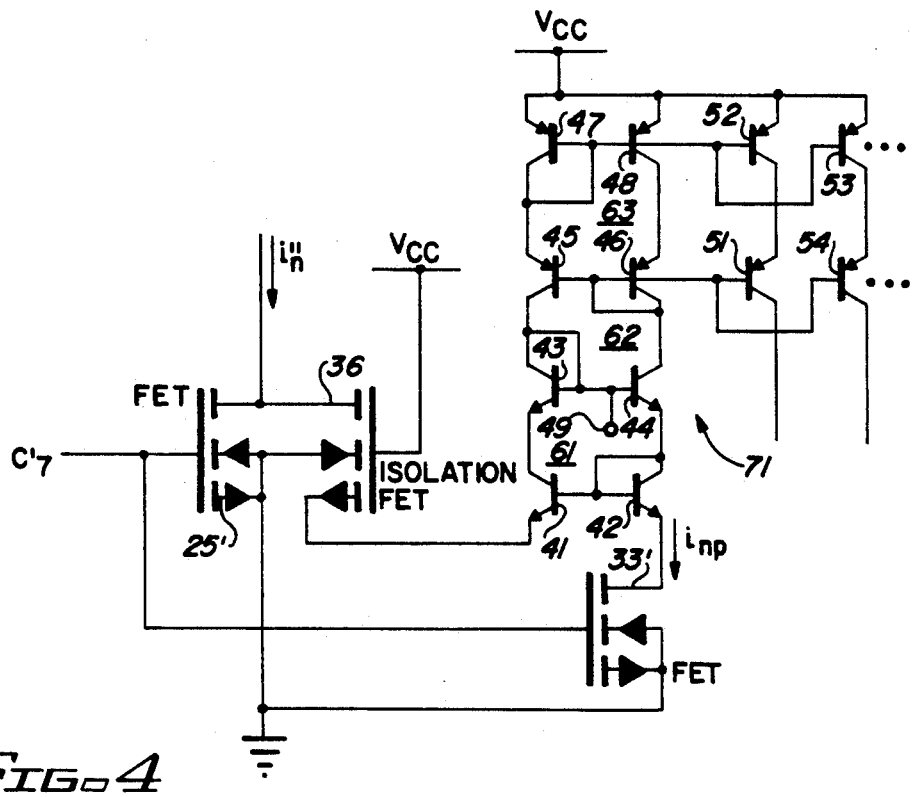
FIG. 4 is a schematic diagram showing a first embodiment of the present invention.

Referring now to FIG. 4, a first embodiment of the present invention provides improved accuracy by matching drain, gate and source voltages and eliminating the need for an operational amplifier. A power FET 25' (also referred to as a switch FET) has a drain connected to a load device, for example, a multi-phase motor (not shown). A sense circuit 71 includes a sense FET 33' having a gate connected to a gate of the power FET 25' for receiving a control signal C7', and a source connected to a source of the power FET 25'. Hence, the gate and source voltages of the sense FET 33' follow the gate and source voltages, respectively, of the power FET 25'. A sense voltage at a drain of the sense FET 33' also accurately follows a load voltage at the drain of the power FET 25' though the drains are not directly connected. Therefore, the sense FET 33' can accurately sense a power FET 25' load current even when the power FET 25' is operating far into its linear region.

The sense FET 33' drain is coupled to the power FET 25' drain by a voltage follower 61 and an isolation FET 36. The isolation FET 36 is provided to protect transistor 41 from the load voltage at the drain of the power FET 25' which may exceed the transistor 41 breakdown voltage. The isolation FET 36 has a drain connected to the drain of the power FET 25', a gate connected to a collector supply voltage ($V_{CC}$), and a source connected to an emitter of the transistor 41. The voltage follower 61 includes the transistor 41 and a transistor 42 which are matched and identically biased, each having a base connected to a collector of the transistor 42. The load voltage at the emitter of the transistor 41 is substantially equal to a sense voltage developed at the emitter of the transistor 42. The emitter of the transistor 42 is connected to the drain of the sense FET 33'. A $V_{be}$ drop (voltage from base to emitter) across a base-emitter junction of the transistor 41 is cancelled by a $V_{be}$ voltage drop across a base-emitter junction of the transistor 42.

A current mirror 62, formed by matched transistors 43 and 44, provides matched bias currents through the transistors 41 and 42. The transistor 44 has an emitter connected to the collector of the transistor 42, a base connected to a base and collector of the transistor 43. The transistor 43 has an emitter connected to a collector of the transistor 41. The current mirror 62 has a bandwidth that is able to accurately follow the pulse width modulated load current and hence the modulated load voltage. As a result, the voltages at the sense FET 33' gate, source and drain terminals accurately follow the voltages at the power FET 25' gate, source and drain terminals, respectively, even at high frequencies. Furthermore, the sense FET 33', the voltage follower 61, and the current mirror 62 are integrated on a single substrate with the power FET 25', and variations due to processing and environmental conditions cancel. An output terminal 49 is available at the bases of the transistors 43 and 44 for providing a bias voltage therefrom.

As the load current through the power FET 25' changes, the load voltage at its drain also changes. The sense voltage at the drain of sense FET 33' drain will follow the load voltage changes through the voltage follower 61. The sense FET 33' is a known scaled proportion of the power FET 25', that is for example, the power FET 25' has a gate width 1000 times greater than the sense FET 33' gate width. For example, a sense current generated in the sense FET 33' that is 1/1000th of the load current. The sense current is an accurate scaled representation of the load current and may be used to monitor the load current. Errors, however, may by induced into the sense current by an Early effect in the transistors 41 and 42. The Early effect is well understood by those skilled in the art and is described in P.R. Gray and R.G. Meyer, "Analysis and Design of Analog Integrated Circuits," New York, John Wiley & Sons, 1977, pp. 16-18. Early effect errors are minimized by stacking additional devices in a cascode configuration.

A cascode current mirror 63 provides transistors 45-48 connected in a cascode configuration and are complementary to the transistors 41-44. The transistor 45 has a collector connected to a collector of the transistor 43, a base connected to a base and collector of the transistor 46 and to the collector of the transistor 44, and an emitter connected to a collector and base of the transistor 47. The transistor 46 has an emitter connected to a collector of the transistor 48. The transistor 48 has a base connected to a base of the transistor 47 and an emitter connected to the $V_{CC}$ supply voltage. The transistor 47 also has an emitter connected to the $V_{CC}$ supply voltage. Additional scaled replicas of the sense current may now easily be provided by adding current legs to the cascode current mirror 63 (or by connecting a current leg to the output 49). A first current leg is provided by transistors 51 and 52 and a second current leg is provided by transistors 53 and 54. The transistors 52 and 53 each have an emitter connected to the $V_{CC}$ supply voltage, a base connected to a base of the transistor 47, and a collector connected to an emitter of the transistors 51 and 54, respectively. The transistors 51 and 54 each have a base connected to a base of the transistor 46, and a collector for providing the replicated currents. The isolation FET 36, the sense FET 33', and the transistors 41-48 and 51-54, which make up the sense circuit 71, are duplicated for each power FET.

Figure 5:
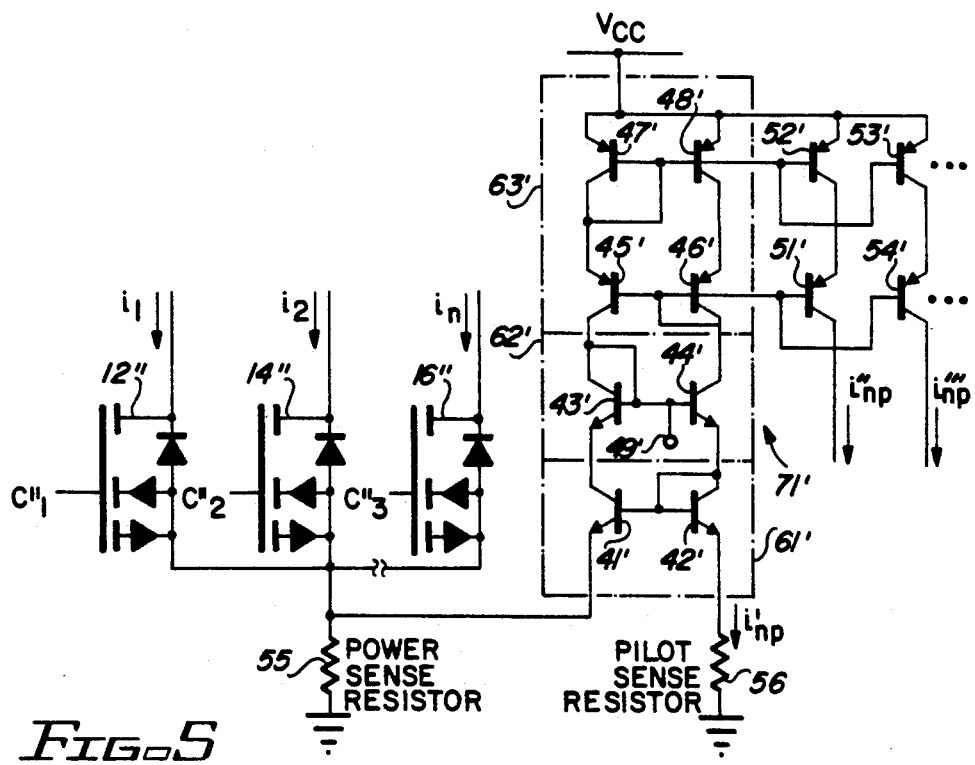
FIG. 5 is a schematic diagram showing a second embodiment of the present invention.

Referring to FIG. 5, a second embodiment of the invention is shown. The second embodiment provides an area improvement over the first embodiment because the sense circuit 71 need not be duplicated for each power FET. Instead, power FETs 12", 14", and 16" are connected to a single sense circuit 71', and each of the power FETs has a drain connected to a load device, and a gate connected to a control signal. The sense circuit 71' includes a power sense resistor 55 coupled between a source of each power FET 12", 14" and 16" and a ground supply voltage. A pilot sense resistor 56 is coupled between a voltage follower 61' and the ground supply voltage. The voltage follower 61' includes transistors 41' and 42', each having a base connected to a collector of the transistor 42'. The transistor 41' has an emitter connected to the sources of the power FETs 12", 14", and 16". The transistor 42' has an emitter connected to the pilot sense resistor 56. The sense circuit 71' also includes a current mirror 62', a cascode current mirror 63', and two current legs made up of transistors 51'-54'. These elements of the sense circuit 71' are connected identically to the current mirror 62, the cascode current mirror 63 and the transistors 51-54 of FIG. 4.

The power sense resistor 55 and the pilot sense resistor 56, like the power FET 25' and the sense FET 33', are ratioed devices. If the ratio is set at 1000x, then given a 1 OHM power sense resistor 55, the pilot sense resistor 56 would be 1,000 OHMS. Since a load voltage at the transistor 41' emitter is impressed at the transistor 42' emitter, the sense current flowing through the pilot sense resistor 56 is 1/1000th of the load current flowing through power sense resistor 55. The sense current is thus a scaled current of the load current. Accuracy of the sense current does not depend upon the absolute value of the power sense resistor 55 or the pilot sense resistor 56. Instead, the accuracy of the sense current is a function of the ratios of the resistor 55 and 56 which can be made very accurate.

While the invention has been particularly described with reference to particular embodiments thereof, it will be understood by those skilled in the art that various other changes in detail may be made therein without departing from the spirit, scope, and teaching of the invention. For example, the present invention has been described for a power amplifier providing a current to a motor of a tape drive, but the invention is equally applicable to power amplifiers driving other types of loads as well. While the load current has been described as being a high frequency PWM current, the sensing scheme may also be applied to other types of high frequency, low frequency or steady state currents. Furthermore, the invention is not intended to be limited to semiconductor technologies optimized for power transistors. Also, the resistors 55 and 56 may be replaced by diodes, field effect transistors or other devices.

What is claimed is:

1. A sensing circuit for monitoring a load current, comprising:
    first sense means coupled to a load device for receiving a load current therefrom and providing a load voltage, the first sense means having a first characteristic value;
    a voltage follower coupled to the first sense means for receiving the load voltage and providing a sense voltage which follows the load voltage; and
    second sense means coupled to the voltage follower for receiving the sense voltage therefrom and providing a sense current, the second sense means having a second characteristic value being a predetermined portion of the first characteristic value wherein the sense current bears the same relationship to the load current as the second characteristic value bears to the first characteristic value.

2. The sensing circuit according to claim 1 wherein the sense voltage magnitude is substantially equal to the load voltage magnitude.

3. The sensing circuit according to claim 1 wherein the first and second sense means are ratioed devices.

4. The sensing circuit according to claim 3 wherein the first sense means is a resistor and the first characteristic value is a first resistance.

5. The sensing circuit according to claim 4 wherein the second sense means is a resistor and the second characteristic value is a second resistance being the predetermined portion of the first resistance.

6. The sensing circuit according to claim 1 further comprising a first current mirror coupled to the voltage follower.

7. The sensing circuit according to claim 6 further comprising a second current mirror coupled to the first current mirror.

8. The sensing circuit according to claim 7 further comprising at least one current leg coupled to the second current mirror for providing an output current having a magnitude that is substantially equal to the sense current magnitude.

9. A monolithically integrated semiconductor power amplifier for providing a load current and monitoring said load current, comprising:
    at least one power transistor coupled to a load device;
    first sense means coupled to said at least one power transistor for receiving a load current therefrom and providing a load voltage, the first sense means having a first characteristic value;
    a voltage follower coupled to said first sense means for receiving the load voltage and generating a sense voltage therefrom, the sense voltage magnitude being substantially equal to the load voltage; and second sense means coupled to said voltage follower for receiving the sense voltage and providing a sense current, the sense current being a predetermined portion of the load current.

10. The power amplifier according to claim 9 wherein the first and second sense means are ratioed devices.

11. The power amplifier according to claim 10 wherein the first sense means is a resistor.

12. The power amplifier according to claim 11 wherein the second sense means is a resistor.

13. The power amplifier according to claim 9 further comprising a first current mirror.

14. The power amplifier according to claim 13 further comprising a second current mirror coupled to the first current mirror.

15. The power amplifier according to claim 14 further comprising at least one current leg coupled to the second current mirror for providing an output current having a magnitude that is a predetermined function of the sense current magnitude.

16. A tape unit capable of monitoring a motor current and adjusting a pulse width modulation of the motor current as a function of the sense current, the tape unit comprising:
a motor;
at least one power transistor coupled to said motor for receiving the motor current therefrom;
power sense means coupled to said at least one power transistor, the motor current flowing through said power sense means, a power sense voltage being generated by said power sense means;
first current mirror means coupled to receive the power sense voltage and for providing a sense current proportional to the motor current;
a first transistor having an emitter coupled to said power sense means, and having a base and a collector coupled to said first current mirror means;
a second transistor having a base coupled to the base of said first transistor, a collector coupled to said first current mirror means, and having an emitter for providing a pilot sense voltage having a magnitude substantially equal to the power sense voltage magnitude; and
pilot sense means coupled to the emitter of said second transistor for receiving the pilot sense voltage therefrom, and providing a pilot sense current having a magnitude proportional to the magnitude of the motor current.

17. The tape unit according to claim 16 wherein the power sense means and the pilot sense means are ratioed.

18. The tape unit according to claim 17 wherein the power sense means is a resistor.

19. The tape unit according to claim 18 wherein the pilot sense means is a resistor.

20. The tape unit according to claim 16 further comprising a second current mirror means coupled to said first current mirror means.

21. The tape unit according to claim 21 further comprising at least one current leg coupled to said second current mirror means for providing an output current having a magnitude substantially equal to the sense current magnitude.

22. The monolithically integrated semiconductor sensing circuit for sensing a load current flowing through a motor, comprising:
a power transistor having a drain coupled to a motor, a gate for receiving a switching signal, and a source coupled to a first supply voltage;
an isolation transistor having a drain coupled to said motor, a gate coupled to a second supply voltage, and a source;
a pilot transistor having a gate coupled to the gate of said power transistor, a source coupled to the first supply voltage, and a drain;
a voltage follower coupled to the source of said isolation transistor and to the drain of said pilot transistor; and
a current mirror coupled to the second supply voltage and to said voltage follower for providing a sense current as a fractional representation of a current through the motor.

23. The sensing circuit according to claim 22 further comprising a cascode current mirror coupled between the second supply voltage and said current mirror.

24. The sensing circuit according to claim 23 further comprising at least one current leg coupled to said cascode current mirror.

25. The sensing circuit according to claim 3 wherein the first sense means is a power FET.

26. The sensing circuit according to claim 25 wherein the second sense means is a FET.

* * * * *

UNITED STATES PATENT AND TRADEMARK OFFICE
CERTIFICATE OF CORRECTION

PATENT NO. :  5,285,143

DATED      :  February 8, 1994

INVENTOR(S) :  Allen A. Bahr, et al.

It is certified that error appears in the above-identified patent and that said Letters Patent is hereby corrected as shown below:

At column 10, line 19, the word "The" should be --A--.

Signed and Sealed this

Twenty-eighth Day of June, 1994

Attest:

BRUCE LEHMAN

*Attesting Officer*      *Commissioner of Patents and Trademarks*